(12) United States Patent
Habara et al.

(10) Patent No.: US 9,182,463 B2
(45) Date of Patent: Nov. 10, 2015

(54) MAGNETIC RESONANCE EXAMINATION APPARATUS AND ANTENNA DEVICE

(75) Inventors: Hideta Habara, Musashino (JP); Yoshitaka Bito, Kokubunji (JP); Hisaaki Ochi, Kodaira (JP); Yoshihisa Soutome, Tokyo (JP); Masayoshi Dohata, Yokohama (JP); Tetsuhiko Takahashi, Tokyo (JP); Hiroyuki Takeuchi, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 734 days.

(21) Appl. No.: 13/577,885

(22) PCT Filed: Jan. 21, 2011

(86) PCT No.: PCT/JP2011/051122
§ 371 (c)(1),
(2), (4) Date: Aug. 8, 2012

(87) PCT Pub. No.: WO2011/105143
PCT Pub. Date: Sep. 1, 2011

(65) Prior Publication Data
US 2012/0299594 A1 Nov. 29, 2012

(30) Foreign Application Priority Data
Feb. 26, 2010 (JP) ................................ 2010-041274

(51) Int. Cl.
*G01R 33/34* (2006.01)
(52) U.S. Cl.
CPC ............................. *G01R 33/34046* (2013.01)
(58) Field of Classification Search
CPC ................................................ G01R 33/34046
See application file for complete search history.

(56) References Cited

U.S. PATENT DOCUMENTS

| 4,751,464 A | 6/1988 | Bridges |
| 5,557,247 A | 9/1996 | Vaughn, Jr. |

(Continued)

FOREIGN PATENT DOCUMENTS

| JP | 2000-166895 A | 6/2000 |
| JP | 2006-270674 A | 10/2006 |

(Continued)

OTHER PUBLICATIONS

Cecil E. Hayes, et al., "An Efficient, Highly Homogeneous Radiofrequency Coil for Whole-Body NMR Imaging at 1.5 T", Journal of Magnetic Resonance, 63, pp. 622-628 (1985).

(Continued)

*Primary Examiner* — Dixomara Vargas
(74) *Attorney, Agent, or Firm* — Miles & Stockbridge P.C.

(57) ABSTRACT

There is provided a technique for securing a comfortable examination space in a tunnel type MRI apparatus without increasing the manufacturing cost of the MRI apparatus and sacrificing performance thereof. In an RF coil provided with a hollow-shaped outer conductive element and a strip-shaped conductive element disposed along the outer conductive element in the axial direction, meander lines constituting the strip-shaped conductive element are disposed at uneven distances from the outer conductive element to secure an internal space. In order to obtain uniform sensitivity at the center of the RF coil, the strip-shaped conductive element is constituted with N of connected meander lines, and length of the strip-shaped conductive element is adjusted so that, in the strip-shaped conductive element resonating at resonance frequency of the antenna, nodes are formed in a number of $(M+1) \times N - 1$, wherein M is 0 or a natural number of 1 or larger.

13 Claims, 11 Drawing Sheets

(56) References Cited

U.S. PATENT DOCUMENTS

| | | | |
|---|---|---|---|
| 6,054,856 A * | 4/2000 | Garroway et al. | 324/318 |
| 7,397,246 B2 * | 7/2008 | Freytag et al. | 324/318 |
| 8,143,896 B2 * | 3/2012 | McDowell et al. | 324/322 |
| 2006/0214859 A1 | 9/2006 | Ide | |
| 2011/0204890 A1 | 8/2011 | Habara et al. | |

FOREIGN PATENT DOCUMENTS

| | | |
|---|---|---|
| JP | 2007-275164 A | 10/2007 |
| JP | 2008-067807 A | 3/2008 |
| JP | 2008-532609 A | 8/2008 |

OTHER PUBLICATIONS

Xiaoliang Zhang, et al., "Higher-Order Harmonic Transmission-Line RF Coil Design for MR Applications ", Magnetic Resonance in Medicine, 53, pp. 1234-1239 (2005).

B.Wu, et al., "16-channel microstrip array using 1st and 2nd harmonics for parallel imaging at 7T", Proceedings of the International Society for Magnetic Resonance in Medicine 16, May 9, 2008, p. 437.

B.Wu, et al., "Multi-purpose Flexible Transceiver Array at 7T", Proceedings of the International Society for Magnetic Resonance in Medicine 17, Apr. 24, 2009, p. 107.

S.Orzada, et al., "A flexible 8-channel transmit/ receive body coil for 7 T human imaging", Proceedings of the International Society for Magnetic Resonance in Medicine 17, Apr. 24, 2009, p. 2999.

Z.Xie, et al., "A novel decoupling technique for non-overlapped microstrip array coil at 7T MR imaging", Proceedings of the International Society for Magnetic Resonance in Medicine 16, May 9, 2008, p. 1068.

S.Orzada, et al., "8-channel transmit/receive head coil for 7T human imaging using intrinsically decoupled strip line elements with meanders", Proceedings of the International Society for Magnetic Resonance in Medicine 17, Apr. 24, 2009, p. 3010.

G.Khym, et al., "Field Calculation and Design of Body RF Coil with Multiple Strips for Open MRI System by Circuit Analysis and Pseudo Electric Dipole Radiation", Proceedings of the International Society for Magnetic Resonance in Medicine 11, Jul. 16, 2003, p. 2395.

A.Jones, et al., "Decoupling method for high frequency strip-line probes gives truly independent elements", Proceedings of the International Society for Magnetic Resonance in Medicine 14, May 12, 2006, p. 3525.

S. Orzada, et al., "A novel 7 T microstrip element using meanders to enhance decoupling", Proceedings of the International Society for Magnetic Resonance in Medicine 16, May 3, 2008, p. 2979.

* cited by examiner

MAGNETIC RESONANCE EXAMINATION APPARATUS AND ANTENNA DEVICE

TECHNICAL FIELD

The present invention relates to an antenna device for transmitting and receiving electromagnetic waves, and a magnetic resonance examination apparatus (henceforth referred to as "MRI apparatus") using it.

BACKGROUND ART

In MRI apparatuses, imaging of a subject is attained by irradiating the subject stayed in a uniform static magnetic field generated by a static magnetic field magnet with electromagnetic waves to induce excitation of nuclear spins in the subject, receiving electromagnetic waves generated by the nuclear spins, i.e., magnetic resonance signals, and processing the signals. The irradiation of the electromagnetic waves and reception of the magnetic resonance signals are performed by a device for transmitting and receiving electromagnetic waves of radio frequency (RF), which is called RF antenna or RF coil.

RF coils are roughly classified into two kinds of those called surface antennas or local antennas, and those called volume coils or volume antennas. The surface antennas have a round shape or tabular shape, and show sensitivity in a region near the antennas, and they are used by being put on surface of a subject. On the other hand, the volume antennas have a cylindrical shape or a shape of two discs disposed upper and lower sides, and they show sensitivity in the whole volume in the cylinder or between the discs, and used by placing a subject in that space.

Examples of the volume antennas having a cylindrical shape include those of birdcage type (refer to, for example, Non-patent document 1), and those of TEM type (refer to, for example, Patent documents 1 and 2). In these volume antennas, about 16 to 24 conductive elements of a rod shape usually called rungs (crossbars or rungs of ladder) are disposed in parallel to the center axis of the cylinder and along the side of the cylinder.

Such volume antennas having a cylindrical shape are used in MRI apparatuses of the tunnel type. In MRI apparatuses of the tunnel type, a static magnetic field magnet is disposed in a cylindrical shape to form a tunnel, a subject laid on a bed is entered into the inside of the tunnel, and imaging is performed.

Regions in which sensitivity of local antennas can be obtained often correspond to only a part of such regions of volume antennas and are narrower than such regions of volume antennas. However, since sensitivity of local antennas is usually higher than that of volume antennas, local antennas are often used as a receiving antenna. Examples of the local antennas include, for example, one consisting of a conductive element bent in the shape of a loop (refer to, for example, Patent document 3), one consisting of a conductive element bent in the shape of figure eight (refer to, for example, Non-patent document 2), and so forth.

When it is desired to image a wide region with good sensitivity, a plurality of local antennas may be disposed to extend the region in which sensitivity can be obtained, and used as if it is a multi-channel volume antenna. In such a case, the antenna is constituted as an antenna having electric power supplying and receiving terminals in a number corresponding to the channel number of 3 or more, whereas the channel number of general volume antennas is 2.

PRIOR ART DOCUMENTS

Non-Patent Documents

Non-patent document 1: Cecil E. Hayes, et al., "An Efficient, Highly Homogeneous Radiofrequency Coil for Whole-Body NMR Imaging at 1.5 T", Journal of Magnetic Resonance, 63:622-628 (1985)

Non-patent document 2: Xiaoliang Zhang, et al., "Higher-Order Harmonic Transmission-Line RF Coil Design for MR Applications", Magnetic Resonance in Medicine, 53:1234 (2005)

Patent Documents

Patent document 1: U.S. Pat. No. 4,751,464
Patent document 2: U.S. Pat. No. 5,557,247
Patent document 3: Japanese Patent Unexamined Publication (KOKAI) No. 2006-270674

SUMMARY OF THE INVENTION

Object to be Achieved by the Invention

For such tunnel type MRI apparatuses as mentioned above, it is desired to secure the inside of the tunnel into which a subject is entered as larger as possible, and thereby provide an examination environment in which even large build subjects and subjects with claustrophobia can comfortably have an MRI examination without anxiety. In general, in the tunnel type MRI apparatuses, a static magnetic field magnet, a gradient coil, and an RF coil are disposed in this order from the outside to the inside of the tunnel. Therefore, for the purpose of making the inside of the tunnel larger to secure a comfortable examination space, it is the easiest solution to make the internal diameter of the static magnetic field magnet larger. However, in order to make the internal diameter of the static magnetic field magnet larger, it is necessary to use a larger static magnetic field magnet, and this leads to marked increase of the manufacturing cost.

Moreover, in the volume antennas of cylindrical shape disclosed in the aforementioned prior art documents, the rungs of the aforementioned number are disposed with equal intervals for the circumferential direction. Therefore, if these volume antennas are used as an RF coil, the internal wall of the tunnel has a circular section. Since this shape does not necessarily correspond to the shape of human body laid on a bed as the subject, it is difficult to secure a space for the shoulder width direction, in particular, at the positions of both shoulders.

The present invention was accomplished in view of the aforementioned circumstances, and an object of the present invention is to provide a technique for securing a comfortable examination space in a tunnel type MRI apparatus without increasing the manufacturing cost of the MRI apparatus and sacrificing performance thereof.

Means for Achieving the Object

According to the present invention, in an RF coil provided with an outer conductive element having a hollow cylindrical shape and one or more strip-shaped conductive elements disposed inside the outer conductive element along the same, the strip-shaped conductive elements are each constituted by connecting N of meandering or straight lines and disposed so that distances between the lines and the outer conductive element are uneven, and thereby an internal examination space is secured. In order to obtain uniform sensitivity in the inside of the RF coil, each strip-shaped conductive element is characterized in that the strip-shaped conductive element has electrically one turning conductive element part, one or more capacitors connected to the conductive element in series, and a feeding and receiving means connected in parallel with one of the capacitors, and resonates at a desired resonance frequency, and nodes at which electric current does not flow are formed in the strip-shaped conductive element when it resonates in a number of (M+1)×N−1, wherein M is 0 or a natural number of 1 or larger.

More specifically, there is provided a magnetic resonance examination apparatus, which comprises an antenna device used for at least one of transmission and reception of a signal and comprising: a hollow cylindrical conductive element, and at least two of conductive elements disposed at a certain distance from internal surface of the cylindrical conductive element substantially in a parallel with the center axis of the cylindrical conductive element and having a meandering portion between both ends, wherein each of the conductive elements has a feed point.

The present invention also provides an antenna device used for at least one of transmission and reception of a signal, which comprises: a hollow cylindrical conductive element, and at least two of conductive elements disposed at a certain distance from internal surface of the cylindrical conductive element substantially in parallel to the center axis of the cylindrical conductive element and having a meandering portion between both ends, and wherein each of the conductive elements has a feed point.

Effect of the Invention

According to the present invention, a comfortable examination space can be secured in a tunnel type MRI apparatus without increasing manufacturing cost of the MRI apparatus and without sacrificing performance thereof.

MODES FOR CARRYING OUT THE INVENTION

<<First Embodiment>>

Hereafter, the first embodiment of the present invention will be explained. In all the drawings for explaining the embodiments of the present invention, the same numerical symbols are used for elements having the same functions, and repetitive explanations of these are omitted.

Figure 1:
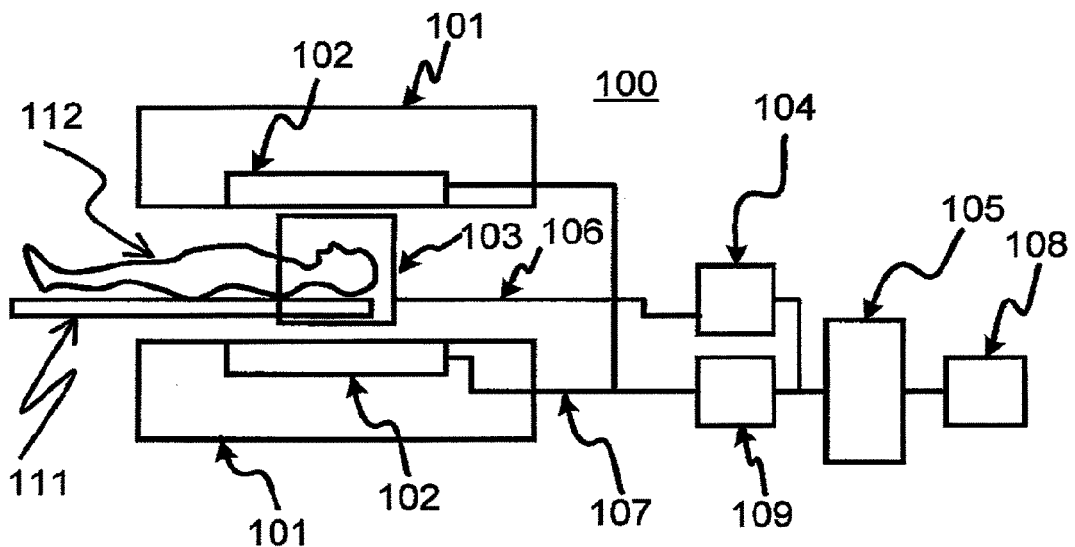
FIG. 1 is a schematic configurational diagram of an MRI apparatus according to the first embodiment.

First, configuration of the MRI apparatus according to this embodiment will be explained. FIG. 1 shows a schematic configurational diagram of an MRI apparatus 100 according to this embodiment. The MRI apparatus 100 is provided with a magnet 101 which forms a static magnetic field in a measurement space where a subject 112 is stayed, a gradient coil 102 which applies a magnetic field gradient of a predetermined direction to the static magnetic field, an RF coil 103 which is inserted into the magnet 101, transmits electromagnetic waves such as radiofrequency waves to the subject 112, and receives electromagnetic waves, a transceiver 104 which is connected to the RF coil 103, creates electromagnetic waves to be irradiated from the RF coil 103, transmits them, detects nuclear magnetic resonance signals from the RF coil 103, and processes the signals, a gradient magnetic field power supply 109 which supplies electric current to the gradient coil 102, a data processing part 105 which controls drive of the transceiver 104 and the gradient magnetic field power supply 109, and performs various kinds of information processing, and through which the apparatus is operated by an operator, and a display 108 for displaying results of processing performed by the data processing part 105.

The gradient magnetic field power supply 109 and the gradient coil 102 are connected with a gradient magnetic field control cable 107. Further, the RF coil 103 and the transceiver 104 are connected with a transmission and reception cable 106 for transmitting and receiving signals between the RF coil 103 and the transceiver 104. The transceiver 104 is further provided with a synthesizer, power amplifier, receiving mixer, analogue to digital converter, transmit-receive changeover switch, and so forth, although they are not shown in the drawing.

The MRI apparatus 100 may be of a horizontal magnetic field type or a vertical magnetic field type according to the direction of the static magnetic field formed by the magnet 101. In the case of the horizontal magnetic field type, the magnet 101 generally has a cylindrical bore (center space), and generates a static magnetic field along the side-to-side direction in FIG. 1. On the other hand, in the case of the vertical magnetic field type, a pair of magnets are disposed on both the up and down sides of the subject, and generate a static magnetic field along the up-and-down direction in FIG. 1. The MRI apparatus 100 of this embodiment is of the horizontal magnetic field type, where the magnet has a bore of a cylindrical shape.

In the MRI apparatus 100 having the aforementioned configuration, electromagnetic waves and a gradient magnetic field are intermittently irradiated at intervals of around several milliseconds on the subject 112 stayed in the static magnetic field with the RF coil 103 and the gradient coil 102, respectively, signals emitted from the subject 112 by resonance with the electromagnetic waves are received, and signal processing is performed to obtain a magnetic resonance image. The subject 112 is, for example, a predetermined part of human body, laid on a bed 111, and placed in the inside of the RF coil 103. Further, the electromagnetic waves and the gradient magnetic field are irradiated and applied with the RF coil 103 and the gradient coil 102, respectively.

In this drawing, although a single RF coil is shown as the RF coil 103 for irradiation and reception of electromagnetic waves, the present invention is not limited to such a configuration. For example, an RF coil consisting of a plurality of coils such as a combination of an RF coil for wide range imaging and an RF coil for parts may be used as the RF coil 103.

Figure 2:
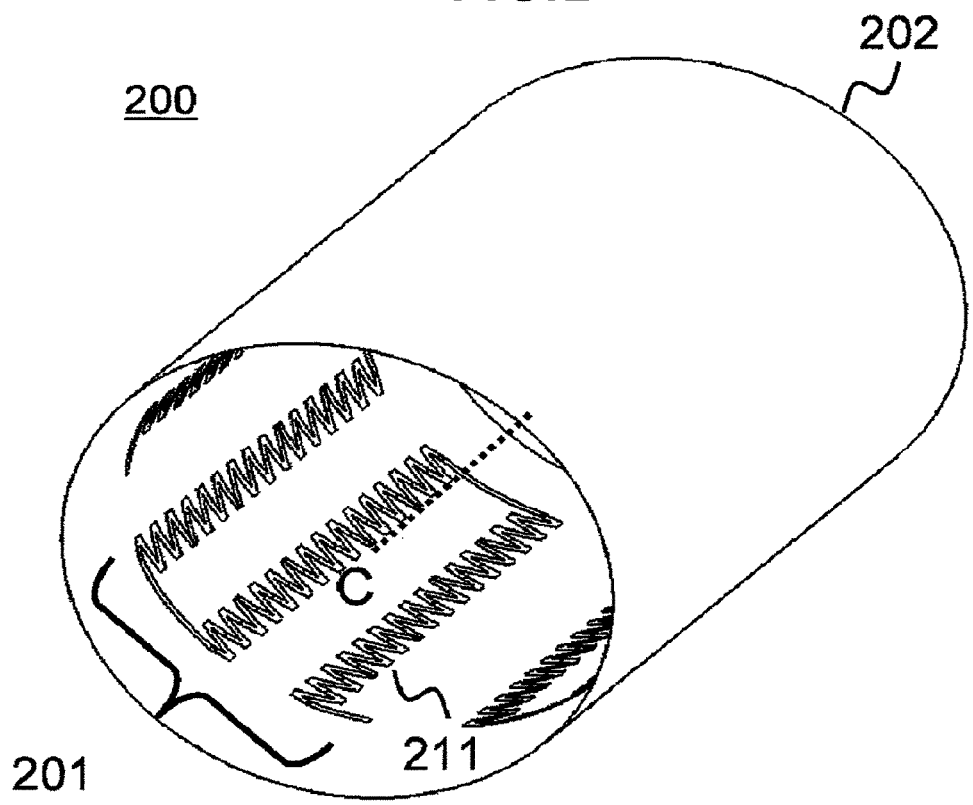
FIG. 2 is an exterior view of an antenna according to the first embodiment.
Figure 3:
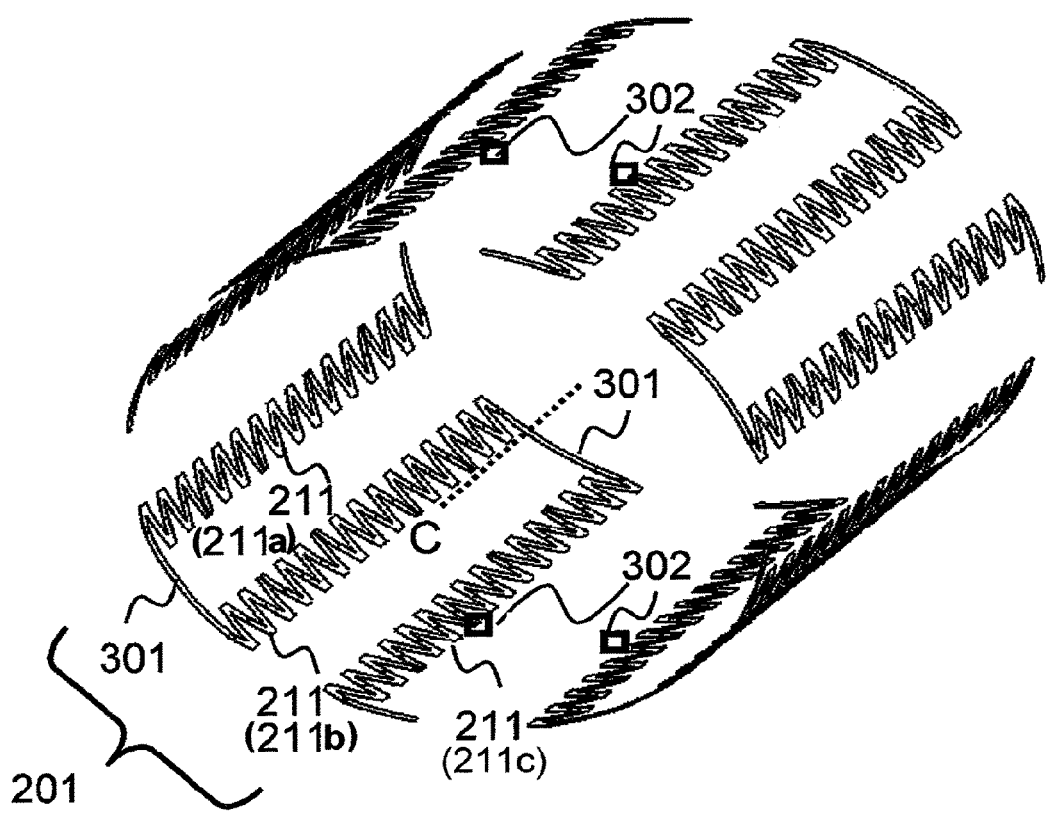
FIG. 3 is an explanatory view for explaining the strip-shaped conductive element of the antenna according to the first embodiment.

In this embodiment, an antenna having a circular cylindrical shape or an elliptic cylindrical shape is used as the RF coil 103. Hereafter, an antenna 200 used as the RF coil 103 of this embodiment will be explained with reference to FIGS. 2 and 3. FIG. 2 is an exterior view of the antenna 200 according to this embodiment. In FIG. 3, the cylindrical conductive element of the antenna 200 is not shown, so that the whole internal conductive elements can be seen.

The antenna 200 of this embodiment is provided with conductive elements 201 having a predetermined width (henceforth referred to as strip-shaped conductive elements), and a conductive element 202 having a circular cylindrical shape or an elliptic cylindrical shape and serving as a ground plane (grounding surface) (henceforth referred to as cylindrical conductive element). FIG. 2 shows an example in which the cylindrical conductive element 202 has an elliptic cylindrical shape.

The cylindrical conductive element 202 of this embodiment is formed from a conductive element such as a copper sheet, a copper mesh, or a stainless steel mesh. For example, the cylindrical conductive element 202 formed from a copper sheet is adhered to internal or external wall of a cylindrical case formed from fiber reinforced plastics (FRP) or the like (not shown).

The strip-shaped conductive elements 201 of this embodiment each are made up of a plurality of meandering line members 211. The adjacent meandering line members 211 are connected with a conductive element 301 to constitute one long turned conductive element. This meandering line member 211 is called a meander line 211. In FIG. 3, three meander lines 211 are connected with the conductive elements 301 at two positions to form one long strip-shaped conductive element 201.

The meander line referred to here is a conductive element having a shape of elongated plate, string or pipe meandering in a width for the circumferential direction of the ellipse having the center at the position of the center axis C of the cylindrical conductive element 202 (direction perpendicular to the center axis C). The meander lines 211 are disposed inside the cylindrical conductive element 202, in parallel with the center axis C of the cylindrical conductive element 202, and with intervals for the circumferential direction of the cylindrical conductive element 202.

The meander lines 211 shown in FIG. 3 have a shape meandering zigzag, and this shape is employed in order to gain the length of the meander line 211 as the whole conductive element. Therefore, when the frequency used in the antenna 200 may be comparatively high, and the length of the conductive element may be short, the meander line 211 may not meander, and may have a straight shape as the case may be.

In FIG. 3, four strip-shaped conductive elements 201 are shown. Each strip-shaped conductive element 201 consists of three meander lines 211 (211a, 211b and 211c) connected with the conductive elements 301. Each strip-shaped conductive element 201 is provided with a connecting point 302 to which one transmission and reception means is connected. This connecting point 302 is generally called a "transmission and/or reception point", "feeding point and/or receiving point", port, or channel.

Figure 4:
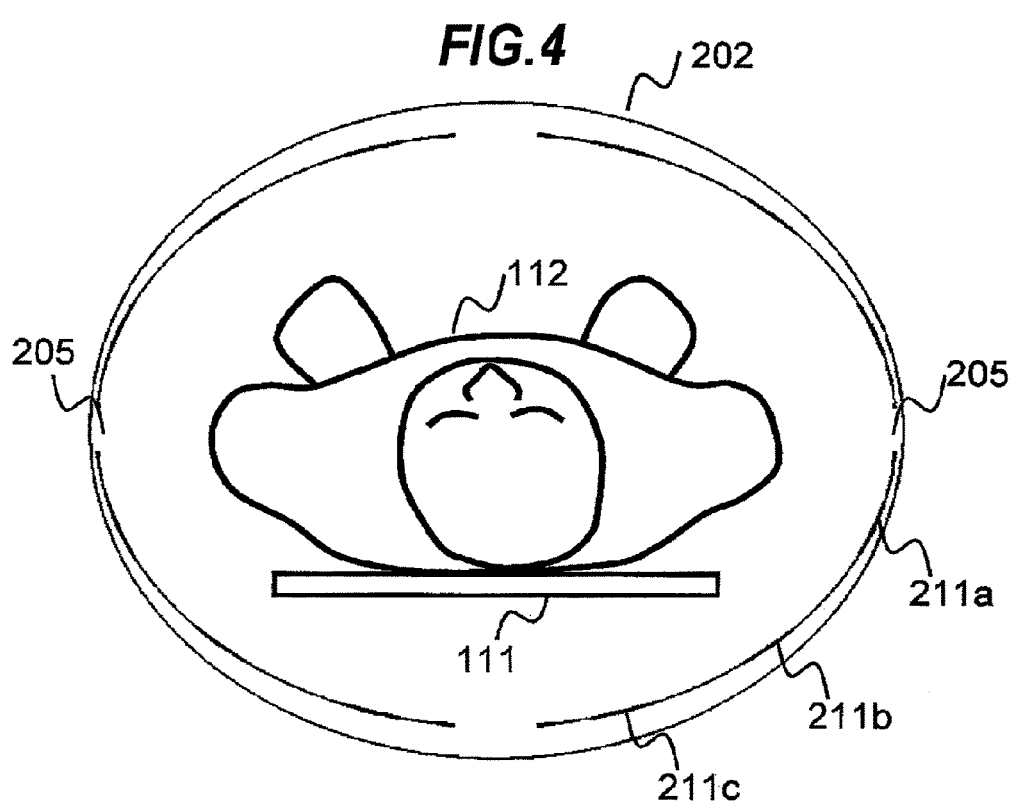
FIG. 4 is a view of the antenna according to the first embodiment and a human entered therein and laid on the back seen from the top of the head.

FIG. 4 shows the cylindrical conductive element 202 of FIG. 2 seen from the opening including the center axis C. In the inside, a laid human as the subject 112 of imaging, and a bed 111 supporting the human are placed. Three of the meander lines 211a, 211b, and 211c constituting each strip-shaped conductive element 201 are arranged along the circumferential direction of a section perpendicular to the center axis C of the conductive element 202, and disposed at positions of different distances from the internal surface of the cylindrical conductive element 202.

Specifically, an elliptic cylinder smaller than the cylindrical conductive element 202 and having a major axis/minor axis ratio different from that of the cylindrical conductive element 202 is provided in the elliptic cylinder constituted by the cylindrical conductive element 202, and the meander lines 211a, 211b, and 211c are disposed on the surface thereof.

This smaller elliptic cylinder is in the inside of the cylindrical conductive element 202, and the distance between the cylindrical conductive element 202 and the internal small elliptic cylinder can be adjusted so that, for example, the distance is slightly large for the up-and-down direction, and slightly small for the side-to-side direction as shown in FIG. 4.

By such an adjustment, a larger space can be secured for the shoulder width direction as the space into which a human as the subject 112 is entered.

Further, this internal small elliptic cylinder may not be constituted by one integral cylinder, and as shown in FIG. 4, it may be constituted by four walls curved in the form of an arc of the ellipse divided at the upper and lower and right and left parts where there is no meander line 211. In this case, there is provided an advantage that the internal space can be extended just before the wall surface of the cylindrical conductive element 202 for the up-and-down and side-to-side directions. Furthermore, there is also provided an advantage that each of the four meander lines 211 can be independently adjusted and attached.

Among the distances between three of the meander lines 211a, 211b and 211c, and the cylindrical conductive element 202, the distances close to the right and left ends (211a) are narrower than those close to the center (211c). By using such a configuration, as the internal space of the antenna 200, a larger space can be secured for the side-to-side direction of a human laid in the inside, especially at the position of both shoulders, compared with the case where all the meander lines 211 are disposed at equal distances from the cylindrical conductive element 202.

As described above, in this embodiment, the meander lines 211 are disposed with a smaller distance with respect to the cylindrical conductive element at a position closer to both shoulders of a human body laid on the stomach or the back and entered into the inside of the cylindrical space as the examination space at the time of examination. Furthermore, in the case of FIG. 4, the strip-shaped conductive element 201 is not disposed at the left and right end positions 205 of the antenna 200. Therefore, a large space can be secured for the shoulder width direction of the human body as the subject 112 at the time of the examination. By using the antenna 200 of this embodiment, a space can be secured at a position at which a subject especially feels narrowness in conventional devices, and therefore an examination space comfortable for the subject 112 can be provided.

Moreover, since the size of the cylindrical conductive element 202 is not changed, the configurations other than that of the RF coil 103 are not affected, and marked increase of the manufacturing cost is not invited, either.

FIGS. 3 and 4 show an example in which one strip-shaped conductive element 201 is made up of three meander lines 211a, 211b, and 211c, and at the time of actual operation of the antenna, electric currents of the same direction flow in the three meander lines 211a, 211b, and 211c. Although the relationship between the flowing direction of electric current, the direction of the magnetic field generated by the electric current and sensitivity of the antenna will be explained later in detail with reference to FIG. 8, it is also briefly explained here.

In the example shown in FIG. 4, at the time of the operation of the antenna, electric currents flow in the three meander lines 211a, 211b, and 211c from the near side to the back side of the drawing at one moment, for example. At that time, as magnetic fields generated by the electric currents, magnetic fields are generated in the clockwise direction around the electric currents according to the electromagnetic right-handed screw rule. Since the directions of three magnetic fields generated by three of the meander lines 211a, 211b and 211c are the same in the antenna 200, magnetic fields are enhanced by each other around the center of the antenna 200, and the antenna sensitivity is improved.

On the other hand, at the portions around the points connecting three of the meander lines 211a, 211b and 211c, i.e., the conductive elements 301 shown in FIG. 3, nodes are formed in which electric current does not flow, therefore magnetic fields generated around those portions are weak, and the sensitivity is also low around the portions. Therefore, there can be obtained an ideal sensitivity profile, in which the sensitivity is low at the both ends of the elliptic cylinder constituted by the cylindrical conductive elements 202 for the axial direction, and the sensitivity is high near the center of the inside of the elliptic cylinder.

That is, since one strip-shaped conductive element 201 shown in FIGS. 3 and 4 comprises three meander lines 211a, 211b and 211c, and two conductive elements 301, a resonant mode generating a standing wave of electric current having two nodes of the electric current and three antinodes as the maximum electric current points in them is a mode showing uniform sensitivity in a wide region in the inside of the elliptic cylinder.

Moreover, in the example shown in FIGS. 3 and 4, three of the meander lines 211a, 211b and 211c are connected to form one strip-shaped conductive element 201 and thereby provide a wide sensitive region with one transmission and reception means. On the other hand, the example shown in FIG. 5 described below, in which one meander line 211 constitutes one strip-shaped conductive element 201, is useful for the case where it is desired to increase the number of the transmission and reception means 503, or limit the region in which the sensitivity is obtained.

Figure 5:
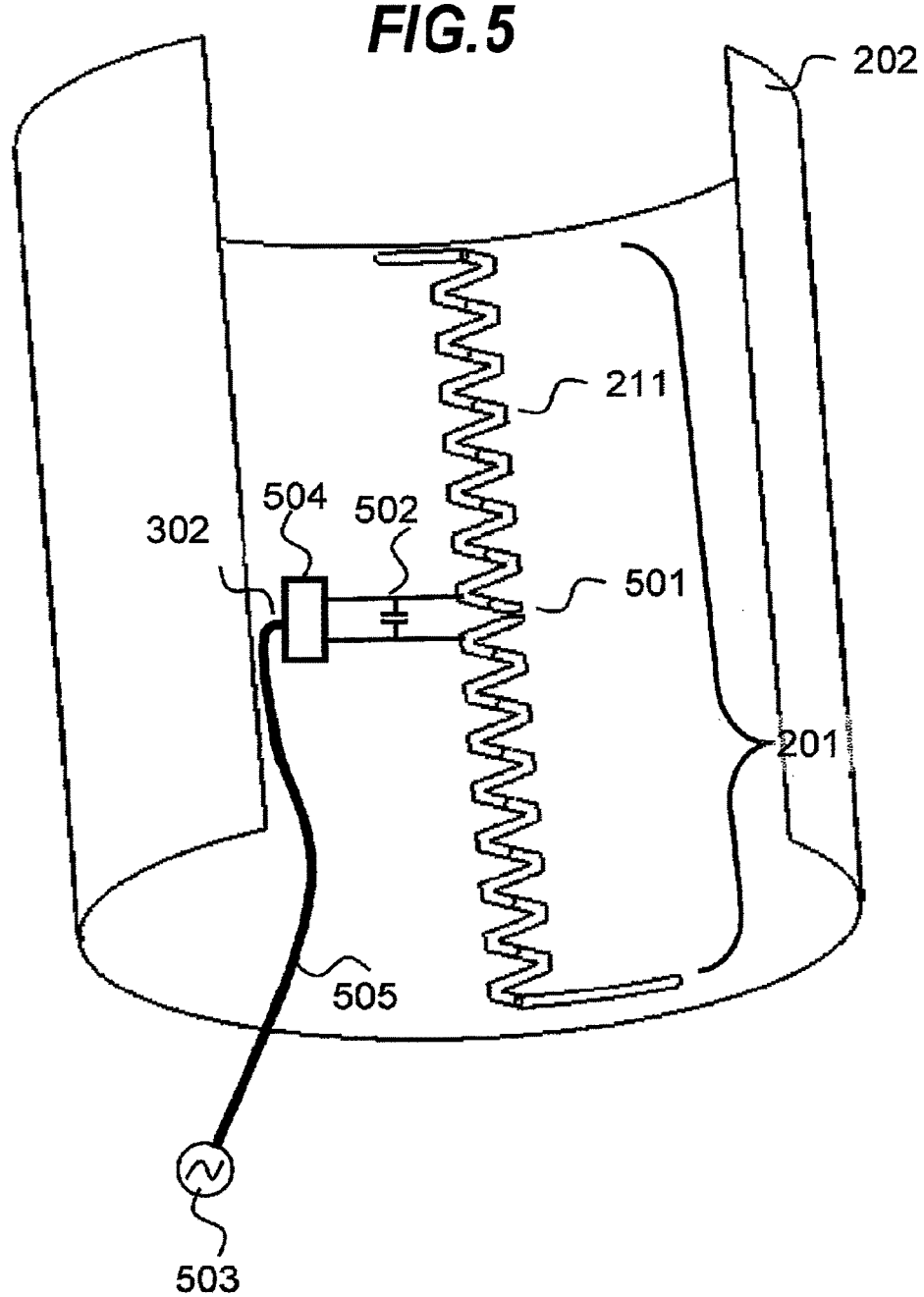
FIG. 5 is an explanatory view for explaining a circuit of a connection part for connection with the transmission and reception means, in which a part of the antenna according to the first embodiment is removed.

In FIGS. 2 to 4, an example in which one strip-shaped conductive element 201 is constituted with three meander lines 211a, 211b and 211c is shown. However, the strip-shaped conductive element 201 may be constituted with one meander line 211. FIG. 5 is a drawing for explaining the antenna 200 in which one strip-shaped conductive element 201 is constituted with one meander line 211. In the drawing, annexed circuits such as the transmission and reception means 503 of the antenna 200 are also shown. When the antenna 200 of this embodiment is used as the RF coil 103 of the MRI apparatus 100, this transmission and reception means 503 corresponds to the transmitter 104 shown in FIG. 1.

In FIG. 5, an upper part of the cylindrical conductive element 202 is removed in order that the strip-shaped conductive element 201 and so forth can be seen well. Inside the cylindrical conductive element 202, one meander line 211 is provided to constitute the strip-shaped conductive element 201.

In the middle of the meander line 211, a gap 501 is provided, and a capacitor 502 is disposed at the gap 501 so as to connect the lines on both sides of the gap in series. The capacitor 502 is connected to a feeding and receiving cable 505 at the connecting point 302 via a matching and balance circuit 504. The other end of the feeding and receiving cable 505 is connected to the transmission and reception means 503. When the antenna 200 of this embodiment is used as the RF coil 103 of the MRI apparatus 100, this feeding and receiving cable 505 corresponds to the transmission and reception cable 106 shown in FIG. 1.

That is, the strip-shaped conductive element 201 constituted with the meander line 211 is connected to the transmission and reception means 503 via the matching and balance circuit 504 connected in parallel with the capacitor 502 at the connecting point 302, and the feeding and receiving cable 505.

Although the feeding and receiving cable 505 is drawn with one thick line in FIG. 5, a cable made up of two conductive elements insulated from each other in the sense of direct current, such as coaxial cable, is usually used.

When the strip-shaped conductive element 201 is constituted from a plurality of meander lines 211 as shown in FIGS. 2 and 3, the same circuit of the connection part for connection with the transmission and reception means 503 as that of the example shown in FIG. 5 is also used. That is, the strip-shaped conductive element 201 is connected to the transmission and reception means 503 via the matching and balance circuit 504 connected in parallel with the capacitor 502 at the connecting point 302, and the feeding and receiving cable 505. In this embodiment, by constituting the circuit as shown in FIG. 5, it becomes possible to operate the strip-shaped conductive element 201 as the antenna 200.

Figure 6:
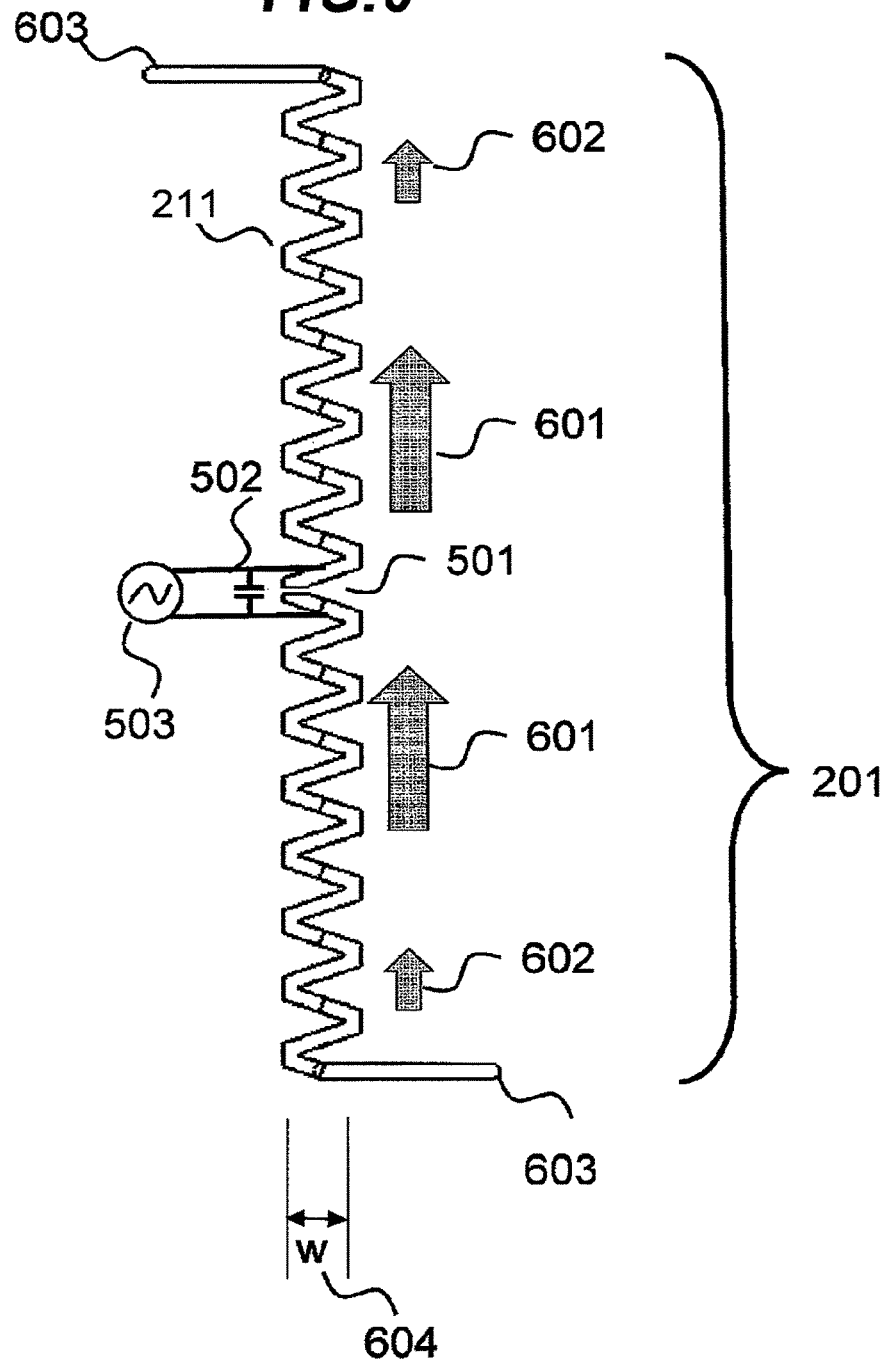
FIG. 6 is an explanatory view for explaining the principle of operation of the antenna according to the first embodiment in the case where the number of nodes is 0.

The principle of the operation of the antenna shown in FIG. 5 will be explained with reference to FIG. 6. FIG. 6 shows elements similar to those shown in FIG. 5, but does not show the cylindrical conductive element 202 for simplicity of the drawing.

The strip-shaped conductive element 201 resonates at a resonance frequency, which is determined by length of the whole strip-shaped conductive element 201 and value of the capacitor 502. When an alternating current power at the resonance frequency is supplied to the strip-shaped conductive element 201 from the transmission and reception means 503, an electric current flows in the strip-shaped conductive element 201. The electric current generates a magnetic field around the conductive element, and magnitude of the magnetic field determines the sensitivity of the coil as the antenna 200 of the MRI apparatus 100. In FIG. 6, the feeding and receiving cable 505 and the matching and balance circuit 504 shown in FIG. 5 are not shown.

Width W604 of meandering of the meander line 211 shown in FIG. 6 is an important parameter for determining length of the whole strip-shaped conductive element 201. If the width W604 is made larger, length of the whole strip-shaped conductive element 201 becomes longer, and the resonance frequency can be set to be low. Further, not only the width W604 of meandering, but also shape of meandering, number of turn in the meandering, length of the portion of the meander line 211 extending along the axial direction of the elliptic cylinder and so forth are also parameters affecting the length of the whole strip-shaped conductive element 201.

A case where the electric current flowing in the strip-shaped conductive element 201 flows in one direction and does not have nodes of electric current will be explained with reference to FIG. 6. In such a case, an electromagnetic wave of half wavelength resonates in the strip-shaped conductive element 201.

Current distribution observed when an electric current flows in the strip-shaped conductive element 201 will be considered. Since both ends 603 of the strip-shaped conductive element 201 are not connected to any element, magnitude of the electric current is zero at the ends.

When a certain moment is supposed, a large electric current (arrow 601) flows in the strip-shaped conductive element 201 around the center thereof, and the magnitude of the electric current becomes smaller at a position closer to the end (arrow 602). In FIG. 6, magnitude of electric current is schematically represented with size of arrow. The same shall apply to the following explanations in this specification. As the antenna, better sensitivity is obtained in a region near a larger electric current (arrow 601).

It is useful to know the number of the nodes as the whole in the cases of adjustment of the resonance frequency of the strip-shaped conductive element, and so forth. Therefore, the number of nodes formed in the whole strip-shaped conductive element 201 as one element is calculated by using the equation: $(M+1) \times N - 1$. In the equation, N represents number of the meander lines 211 constituting one strip-shaped conductive element 201, and M represents number of nodes of electric current existing in one meander line 211 (except for the nodes at both ends).

In the strip-shaped conductive element 201 having one line without no turn (meander line 211) (N=1), there is formed no node (M=0), and therefore the total number of nodes of the current distribution observed in the line of the strip-shaped conductive element 201 is calculated to be $(0+1) \times 1 - 1 = 0$.

Figure 7:
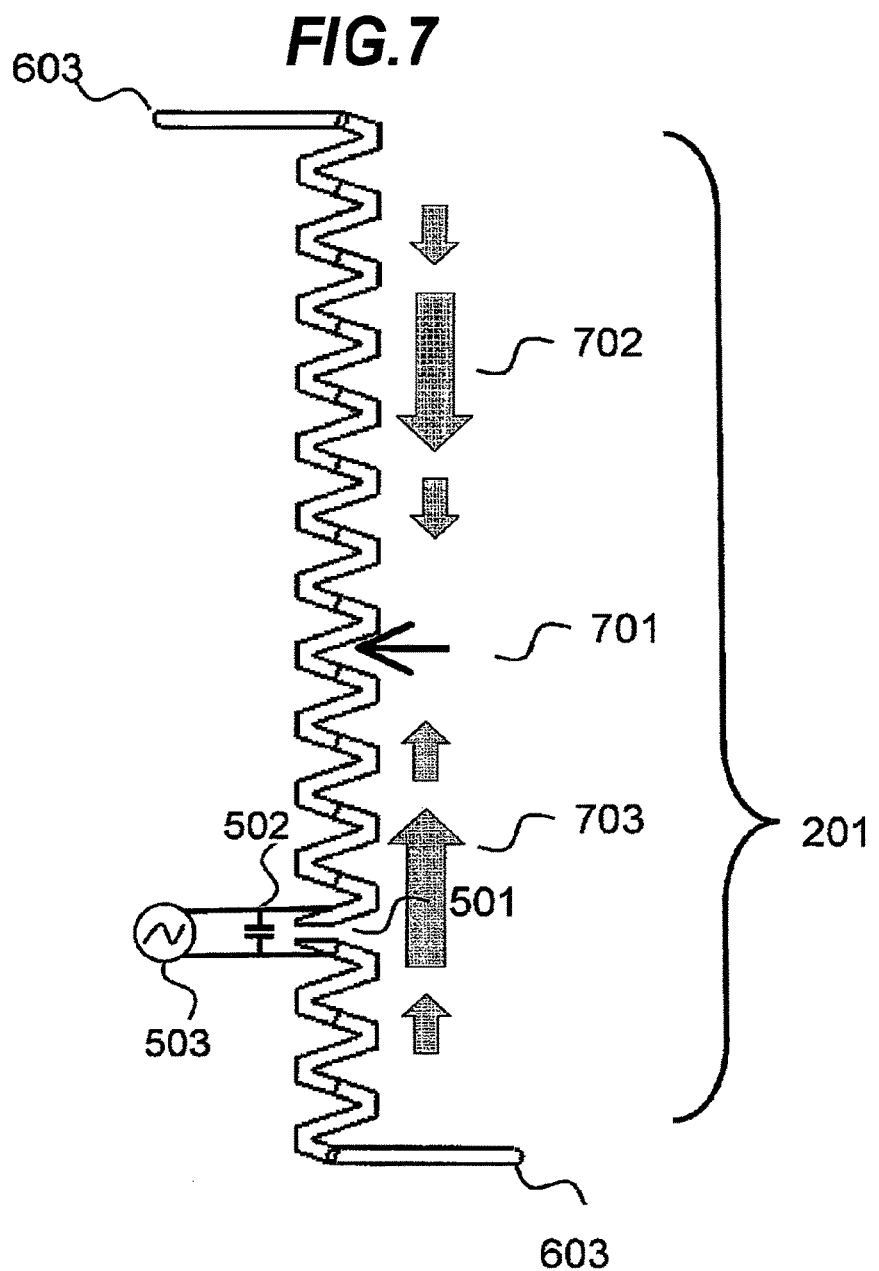
FIG. 7 is an explanatory view for explaining the principle of operation of the antenna according to the first embodiment in the case where the number of nodes is 1.

FIG. 7 shows an example in which the strip-shaped conductive element 201 having a configuration similar to that shown in FIG. 6, but an electric current flowing in this strip-shaped conductive element 201 has one node.

In the example shown in FIG. 7, according to the relationship between length of the whole strip-shaped conductive element 201 and value of the capacitor provided at the gap 501, a node of electric current is formed at a position 701 around the center of the strip-shaped conductive element 201. In this case, an electromagnetic wave of one wavelength resonates in the strip-shaped conductive element 201.

At a certain moment, the electric current flowing in the lower half of the strip-shaped conductive element 201 flows upward (arrow 703), and the electric current flowing in the upper half flows downward (arrow 702). At the position of the node 701, electric current does not flow, and the direction of the electric current flowing in the strip-shaped conductive element 201 is reversed there.

A position at which high sensitivity of the antenna can be obtained is a position near a portion at which an electric current flows well. In the example shown in FIG. 7, the upper and lower positions of the strip-shaped conductive element 201 indicated with the large arrows 702 and 703 are positions at which good sensitivity is obtained. In this example, no sensitivity is obtained around the node 701 at the center of the strip-shaped conductive element 201.

As for two of the configurations shown in FIGS. 6 and 7, the configuration shown in FIG. 6 not forming a node, which shows good uniformity of sensitivity, is usually and often used, but the configuration shown in FIG. 7 forming a node may be intentionally used as the case may be.

Number of nodes formed in the whole strip-shaped conductive element 201 shown in FIG. 7 as one element is calculated as follows in accordance with the aforementioned equation: $(M+1) \times N - 1$. That is, since there is one node (M=1) in one strip-shaped conductive element 201 having a line with no turn (N=1), the total number of nodes in the current distribution formed in the line of the strip-shaped conductive element 201 is calculated to be $(1+1) \times 1 - 1 = 1$.

Figure 8:
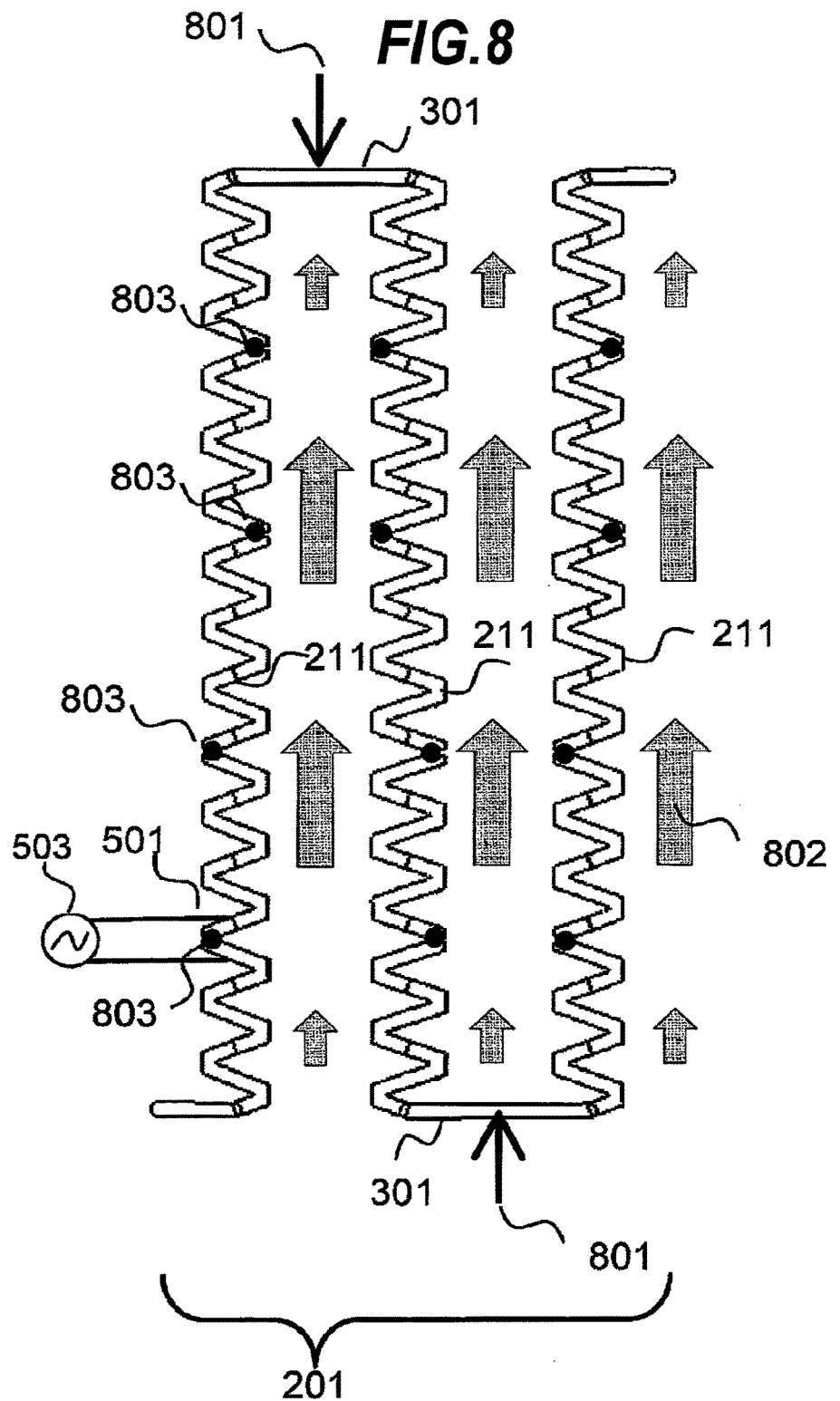
FIG. 8 is an explanatory view for explaining the principle of operation of the antenna according to the first embodiment in the case where the strip-shaped conductive element is constituted with three meander lines in which two of nodes are formed.

FIG. 8 shows an example in which one strip-shaped conductive element 201 is constituted with three meander lines 211. In the strip-shaped conductive element 201 shown in FIG. 8, one node 801 of electric current is formed in each of two conductive elements 301 connecting the adjacent meander lines 211. Therefore, the number of the nodes of the electric current as a whole is 3−1=2, which corresponds to the number obtained by subtracting 1 from the number of the meander lines 211.

Although the capacitor 502 provided at the gap 501 is indicated with the symbol of capacitor in FIGS. 5 to 7, capacitors 803 are indicated with black circles in FIG. 8. FIG. 8 shows an example in which many capacitors 803 are also provided at positions other than the gap 501 at the feeding point. Since phase of alternating electric current flowing in a conductive element changes when it passes through a capacitor, disposition of the capacitor 803 provides an effect of effectually shortening the length of the meander line 211.

That is, when the length of the whole strip-shaped conductive element 201 is unduly long, and thus the resonance frequency is lower than a desired resonance frequency, the capacitor 803 can be disposed to make the resonance frequency to be higher up to the desired resonance frequency.

When electric power of the resonance frequency is supplied from the transmission and reception means 503 disposed in parallel with the capacitor 803 disposed at the gap 501, the electric current induced in the strip-shaped conductive element 201 flows as shown with arrows 802, and directions of the electric currents in three of the meander lines 211 become the same directions at a certain moment.

When the strip-shaped conductive element 201 has the configuration shown in FIG. 8, the directions of electric currents flowing in three of the meander lines 211 are the same, therefore the magnetic fields generated by the electric currents are enhanced by each other, and thus sensitivity of the antenna 200 is improved. Moreover, the configuration of the strip-shaped conductive element 201 shown in FIG. 8 also provides an advantage that the sensitivity can be obtained in a larger volume region for the side-to-side direction in FIG. 8 compared with the configuration of the strip-shaped conductive element 201 shown in FIG. 6.

Number of nodes formed in the whole strip-shaped conductive element 201 as one element of the example shown in FIG. 8 is calculated as follows in accordance with the aforementioned equation: $(M+1) \times N - 1$. That is, since there is no node (M=0) in the strip-shaped conductive elements 201 having three lines (meander lines 211) with turns (N=3), the total number of nodes in the current distribution formed in the line of the strip-shaped conductive element 201 is calculated to be (0+1)×3−1=2.

Figure 9:
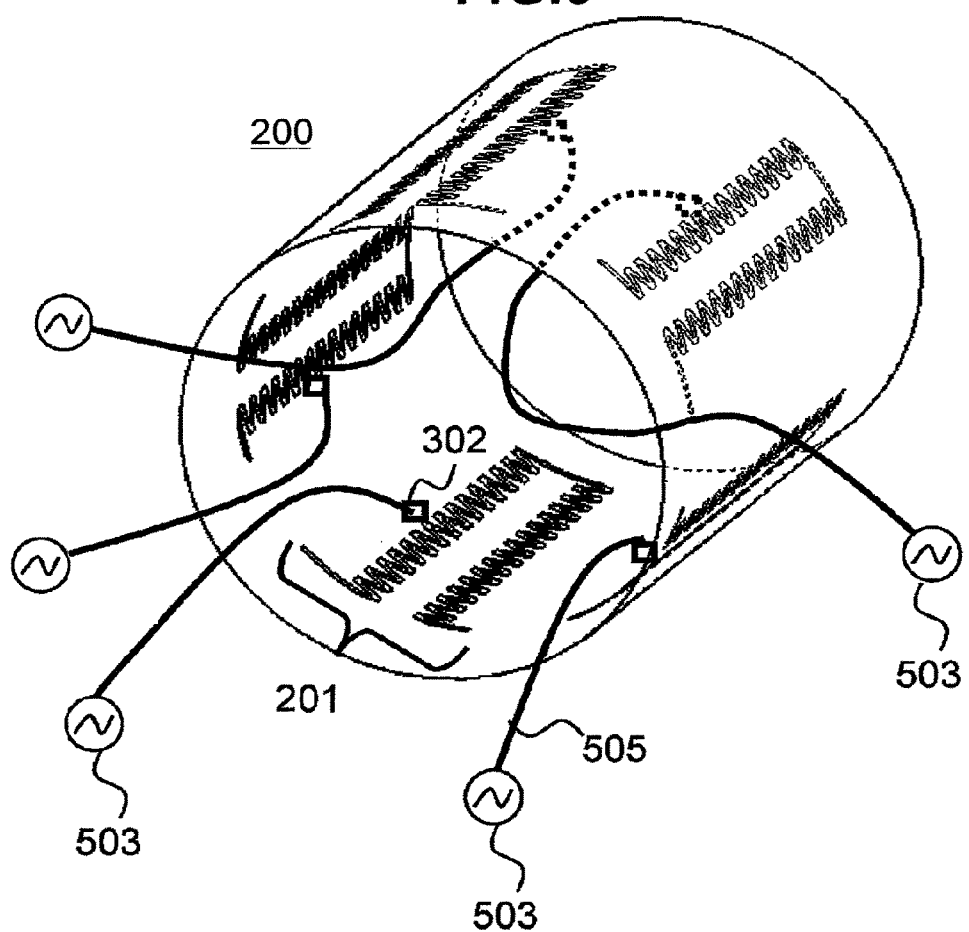
FIG. 9 is an exterior view of an antenna according to the first embodiment, which is constituted with five strip-shaped conductive elements.

Although FIG. 2 shows an example of the antenna 200 provided with four of the strip-shaped conductive elements 201, FIG. 9 shows an example in which the antenna 200 used as the RF coil 103 is constituted with five of the strip-shaped conductive elements 201. As shown in this example, the number Of the strip-shaped conductive elements 201 used in one of the antenna 200 is not limited to 4, but it may be a number of 1 or larger.

The transmission and reception means 503 explained with reference to FIG. 5 is connected to every strip-shaped conductive element 201. Therefore, when there are four of the strip-shaped conductive elements 201 as in the example shown in FIG. 2, four of the transmission and reception means 503 are connected. When there are N (N is a natural number of 1 or larger) of the strip-shaped conductive elements 201, N of the transmission and reception means 503 are provided. Therefore, in the example shown in FIG. 9, there are five transmission and reception means 503.

Value of coupling between the ports among four of the ports 302 shown in FIG. 3 is generally desired to be − (minus) 15 decibels (dB) or lower. And it is known that value of coupling between ports can be made smaller by, for example, making interval of adjacent strip-shaped conductive elements 201 to be larger. According to electromagnetic field calculation simulation, the value of coupling between adjacent ports in the antenna 200 shown in FIG. 3 is about −11 to −16 dB. Therefore, the antenna 200 of this embodiment can be used as it is as an antenna for four-channel input and output without any modification.

When the antenna 200 is used as a four-channel input and output antenna, especially as such an antenna for nuclear magnetic resonance, it may be more efficient to generate a circularly polarized wave in the inside of the elliptic cylinder. For example, if the four channels are defined as channels 1, 2, 3 and 4 in the clockwise direction, and the phase of the electric power supplied to the channel 1 is defined to be 0, a clockwise circularly polarized wave can be induced by supplying electric power with phases of 90 degrees, 180 degrees, and 270 degrees to the channels 2, 3 and 4.

Degree of coupling between the feeding points 302 (ports) is represented with the transmission coefficient of the S parameters. The S parameters have the transmission coefficient and reflection coefficient indicating transmission and reflection characteristics of electromagnetic waves between feeding points, respectively, and can be measured by using a measurement apparatus such as a network analyzer.

For example, in the antenna 200 of this embodiment exemplified in FIG. 3, if the four feeding points 304 are called port 1, port 2, port 3, and port 4 along the circumferential direction, reflection coefficient of port n (n=1 to 4) is described as Snn, and transmission coefficient from port n to port m (m=1 to 4) is described as Smn. When electric power (electric current) is supplied to the port 1, if much electric current flows into the port 2, it is said that the coupling between the port 1 and the port 2 is large, and a parameter indicating magnitude of flowing out degree (value of coupling) is the transmission coefficient S21. If the coupling between both ports is large, amount of electric power (electromagnetic waves) supplied to the strip-shaped conductive element group 201 connected to the transmission and reception cable at the port 1 (henceforth referred to as strip-shaped conductive element belonging to the port 1) and transmitted to the strip-shaped conductive element 201 belonging to the port 2 increases, and efficiency of the antenna is degraded.

Similarly, when electric power (electric current) is supplied to the port 1, and much of it is not supplied to the strip-shaped conductive element group 201 belonging to the port 1 due to reflection, efficiency of the antenna is also degraded. The parameter indicating the amount of reflected power is the reflection coefficient S11. As described above, the volume antenna 200 of this embodiment can decrease the coupling value (transmission coefficient) by the configuration thereof, and thus can maintain the efficiency of the antenna. In addition, it is also possible to employ a configuration for also decreasing the reflection coefficient to further improve the efficiency.

In order to realize it, when imaging is performed by connecting the antenna 200 to the MRI apparatus 100, the matching and balance circuit 504 shown in FIG. 5 or the like is added in order to perform impedance matching between the impedance of the antenna 200 and the impedance of the transmission and reception cable 106.

For example, the impedance Za of the antenna 200 is adjusted to the characteristic impedance Zc of the feeding cable (transmission and reception cable) 106 (for example, 50Ω) at an operating frequency (for example, 128 MHz, which is the magnetic resonance frequency of hydrogen nucleus at 3 teslas).

The reflection coefficient among the S parameters can be thereby reduced, and efficiency of the antenna is improved. Specifically, for example, in the aforementioned case, the reflection coefficient Sli of the port 1 can be made to be −15 dB or lower.

Figure 10:
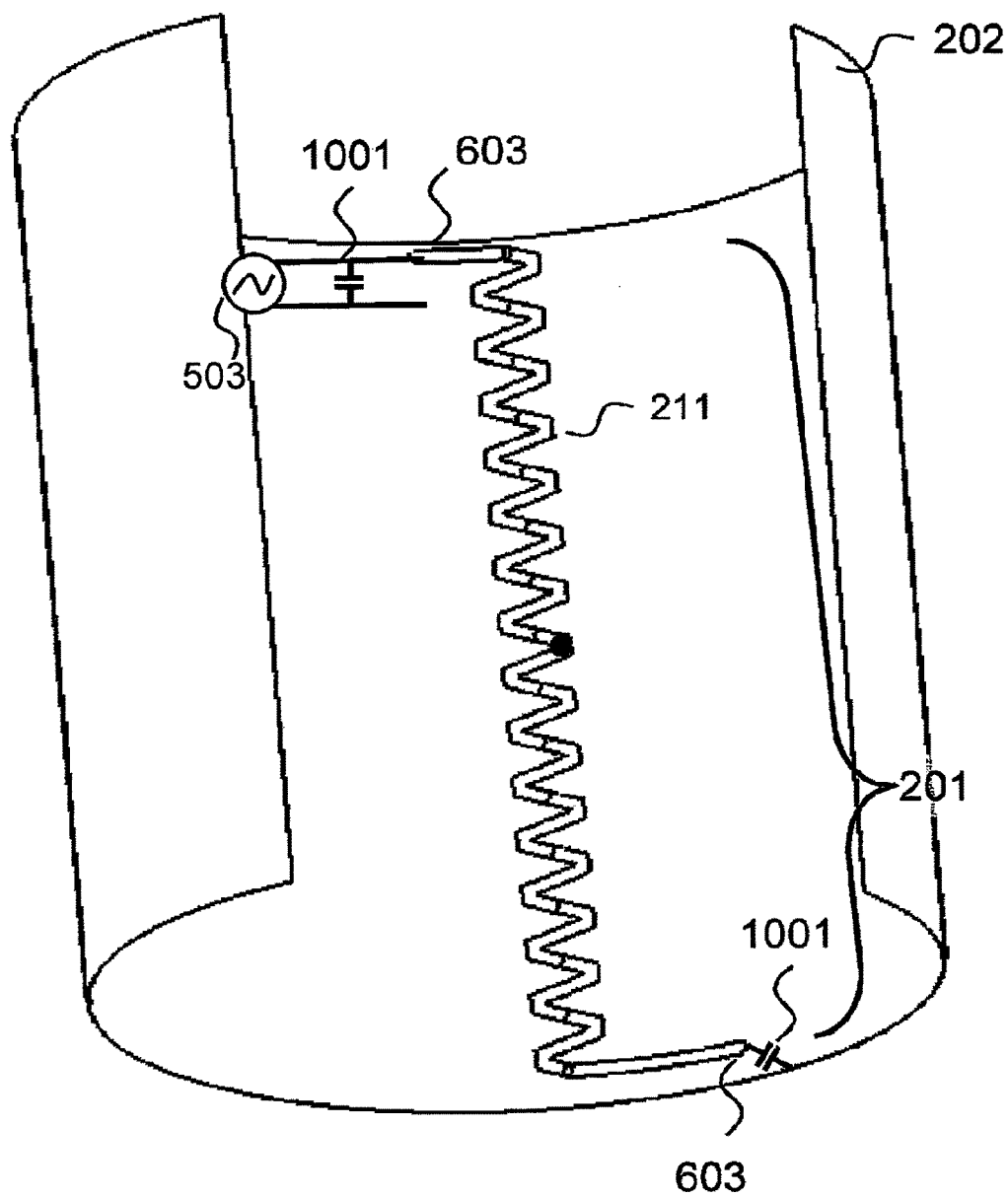
FIG. 10 is an explanatory view for explaining a circuit of connection part for connection with the transmission and reception means in the antenna according to the first embodiment using a different connection scheme, in which a part of the antenna is removed.

A connection scheme for connection with the transmission and reception means 503 different from that shown in FIG. 5 is shown in FIG. 10.

In the example shown in FIG. 10, two of capacitors 1001 are disposed to connect both ends 603 of the strip-shaped conductive element 201 and the cylindrical conductive elements 202. The transmission and reception means 503 is connected to one of the two capacitors 1001 in parallel. By using such a circuit configuration, the strip-shaped conductive element 201 can also be operated as the antenna 200.

The capacitor 1001 disposed between the meander line 211 and the cylindrical conductive element 202 as described above generally has an effect of effectually lengthening the length of the meander line 211, contrary to the capacitor 803 explained in FIG. 8. Therefore, the configuration shown in FIG. 10 may be effective for such a case that a large length of the meander line 211 cannot be used. Moreover, although the transmission and reception means 503 is connected to one of the two capacitors 1001 in parallel in the example shown in FIG. 10, the transmission and reception means 503 may be connected in parallel to the capacitor 502 in the middle of meander line 211 at the connecting point 302 as shown in FIG. 5, and the transmission and reception means 503 may not be connected to the capacitor 1001.

Figure 11:
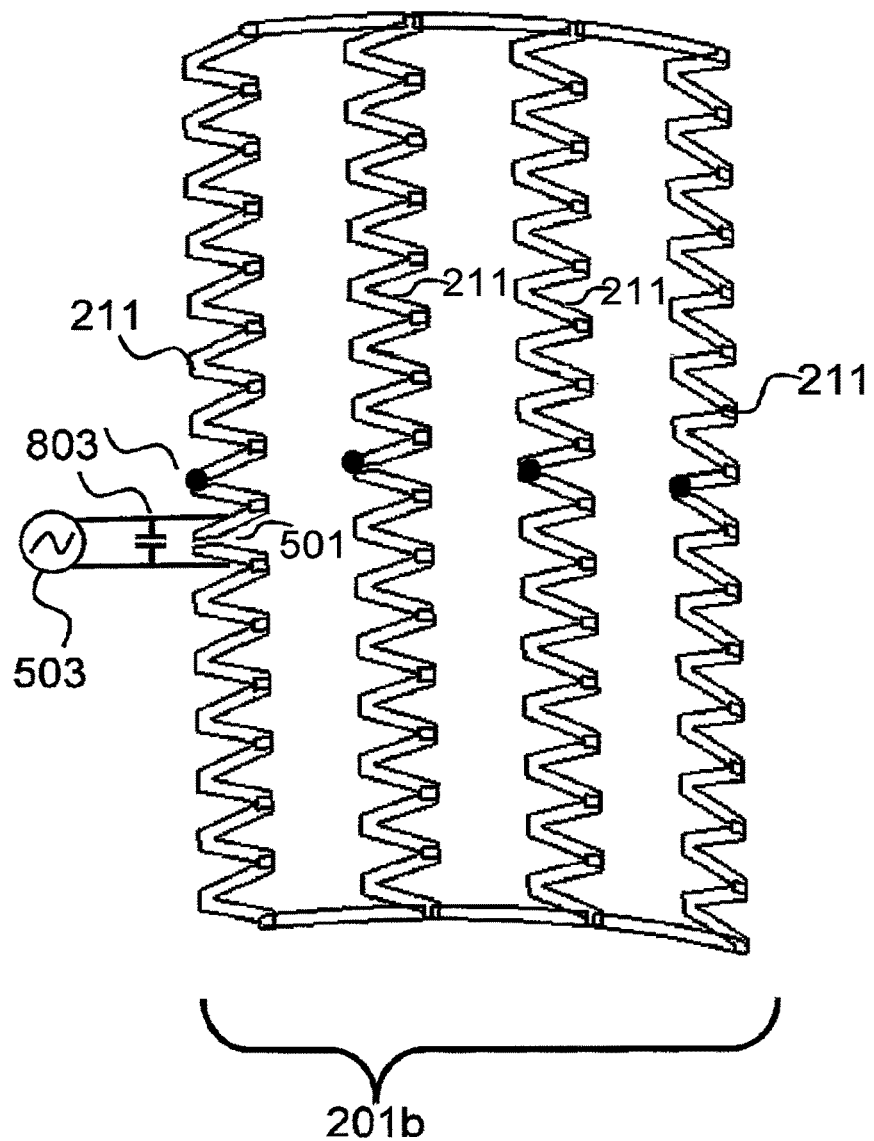
FIG. 11 is an explanatory view for explaining connection in an antenna according to the first embodiment using a different connection scheme of the meander line.

In the example shown in FIG. 8, each set of adjacent meander lines 211 among three meander lines 211 are connected at one position to constitute one strip-shaped conductive element 201 turning twice. However, it is also possible to connect ends of each set of adjacent meander lines 211 at two positions to constitute the strip-shaped conductive element 211 as shown in FIG. 11. In the example shown in FIG. 11, each set of adjacent meander lines 211 among four of them are connected at two positions, respectively, to constitute the strip-shaped conductive element 201b as a whole. The strip-shaped conductive element 201b constituted in such a manner as described is no longer a conductive element forming one line.

However, even with the strip-shaped conductive element 201b, if a capacitor of an appropriate value is chosen as the capacitor 803 connected at the gap 501 of the meander line 211, and the feeding means 503 is connected to the capacitor 803, electric currents may be flown in the meander lines 211 in the same direction as in the example shown in FIG. 8, and the configuration shown in FIG. 11 may also be usable as a modification of the example the antenna shown in FIG. 8.

Further, the cylindrical conductive element 202 of the antenna 200 of this embodiment may be formed from a material other than sheet-shaped material. For example, it may be constituted with a metallic mesh such as copper or stainless steel mesh. Use of a metallic mesh does not degrade the function of the cylindrical conductive element 202 as a ground plane.

Further, when the cylindrical conductive element 202 is formed so that an alternate current of a low frequency of several kilohertzs or lower can flow through the whole elliptic cylinder thereof, an eddy current generated by the gradient magnetic field power supply 109 of the MRI apparatus 100 may flow. To prevent it, the cylindrical conductive element 202 may have a structure that it is constituted by consecutively arranged strips corresponding to divided portions of the side wall of the elliptic cylinder parallel to the axis of the elliptic cylinder, which are connected with capacitors having a large capacitance of several hundreds picofarads.

Further, when the antenna 200 of this embodiment is constituted with four of the strip-shaped conductive elements 201 as shown in FIG. 3, there are four of the feeding points 302 as described above. Therefore, at the time of imaging, electromagnetic waves are supplied from the transceiver 104 to four of the feeding points 302. In this case, electromagnetic waves having the same waveforms and shifted phases may be supplied to the four feeding points, or those having completely different waveforms may be supplied to them.

Moreover, in the case of such a four-channel antenna as shown in FIG. 3, it is also possible to add a circuit for always supplying electromagnetic waves having waveforms of which amplitudes are the same, but phases are different by 180 degrees, to two of the feeding points 302 facing each other, thereby decrease degree of freedom of the phase amplitude, and unify them into one feeding point, so that the antenna having four channels as a whole can be operated as an antenna having two unified channels.

As explained above, according to this embodiment, in an RF coil provided with a hollow outer conductive element and one or more strip-shaped conductive elements disposed along the outer conductive element in the axial direction, intervals between the meander lines constituting the strip-shaped conductive element and the outer conductive element are made uneven to secure an internal space. However, in order to obtain uniform sensitivity at the center section of the RF coil, the strip-shaped conductive elements are constituted with N of connected meander lines, and length of the strip-shaped conductive elements is adjusted so that electromagnetic waves resonate at the resonance frequency of the antenna to form nodes in a number of (M+1)×N−1, wherein M is 0 or a natural number of 1 or larger. With such a configuration, a comfortable examination space can be secured in the tunnel type MRI apparatus 100 without increasing manufacturing cost of the MRI apparatus 100 and without sacrificing performance of the MRI apparatus 100.

<<Second Embodiment>>

The second embodiment of the present invention will be explained below. The MRI apparatus of this embodiment basically has the same configuration as that of the MRI apparatus 100 of the first embodiment. However, in this embodiment, a new configuration is added to the antenna 200 of the first embodiment as the RF coil 103 to attempt further reduction of the coupling value and improvement in the efficiency. Hereafter, an antenna 200b of this embodiment will be explained with emphasizing the configuration different from that of the antenna 200 of the first embodiment.

Figure 12:
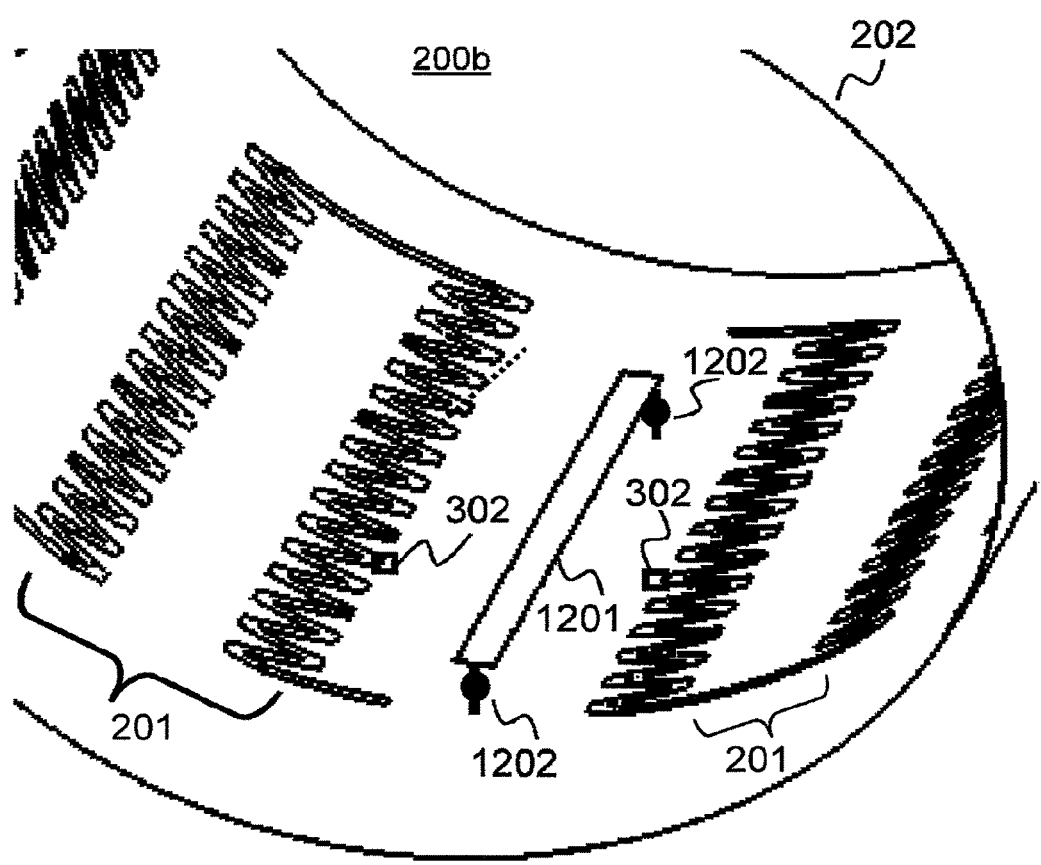
FIG. 12 is an explanatory view for explaining a conductive element for decoupling of an antenna according to the second embodiment.

FIG. 12 shows an external view of the antenna 200b according to this embodiment. For this embodiment, there will be exemplified an antenna comprising four of strip-shaped conductive elements 201, like the antenna 200 shown in FIG. 2 for the first embodiment. In FIG. 12, only two feeding ports of the lower half are shown in the drawing among four of the feeding ports 302. These are called port 1 and port 2 along the circumferential direction.

As shown in FIG. 12, the antenna 200b according to this embodiment is provided with a conductive element 1201 extending in the same direction as the center axis of the elliptic cylinder between two of the strip-shaped conductive elements 201 shown in the drawing. The conductive element 1201 is disposed at a predetermined distance from the internal surface of the cylindrical conductive element 202. Further, the antenna 200b according to this embodiment is provided with capacitors 1202, which connects the both ends of the conductive element 1201 and the cylindrical conductive element 202 at two positions.

The conductive element 1201, two of the capacitors 1202, and the cylindrical conductive element 202 constitute a loop. Coupling between the ports 1 and 2 can be changed by flowing an electric current in this loop. The coupling between the ports can be suppressed by appropriately selecting values of the capacitors 1202.

The conductive element 1201 and two of the capacitors 1202 are disposed between each two of the adjacent strip-shaped conductive elements 201.

Therefore, according to this embodiment, the transmission coefficient can be further reduced in addition to the effect obtainable by the first embodiment, and thus an antenna showing further improved efficiency can be obtained.

The method for reducing coupling between the ports is not limited to the aforementioned method. Various kinds of methods generally used can be applied.

EXAMPLE

An example of use of the antenna 200 of the first embodiment shown in FIG. 2 as an antenna for the trunk of an MRI apparatus using a magnetic field strength of 3 teslas (henceforth referred to as 3—tesla MRI apparatus) will be described below. In this example, imaging nuclide is hydrogen nucleus.

In this example, a cylindrical conductive element 202 formed from a copper sheet or copper mesh having a thickness of several tens to several hundreds micrometers was adhered to an inner wall of a cylindrical case formed from FRP to form an elliptic cylindrical conductive element member. The formed elliptic cylindrical conductive element member had an internal diameter for the major axis of 594 mm, an internal diameter for the minor axis of 520 mm and a length of the elliptic cylinder of 1000 mm.

Strip-shaped conductive elements 201 are disposed on a surface of an elliptic cylinder disposed inside the cylindrical conductive element 202 and having diameters for the major axis and the major axis shorter than those of the cylindrical conductive element 202 by 10 mm and 50 mm, respectively. The disposed strip-shaped conductive elements 201 each had a width of 10 mm, and the meander line 211 had a length of 670 mm from one end to the other end in the axial direction of the elliptic cylinder, and the width W604 for the right-and-left direction of 38 mm. Gaps 501 were provided in the strip-shaped conductive elements 201 at positions of 120 mm and 240 mm from both ends, and capacitors 502 of 100 pF were inserted into the gaps and connected.

The strip-shaped conductive element 201 was constituted with three of the meander lines 211. There were disposed four of the strip-shaped conductive elements 201 as shown in FIGS. 2 and 3.

Further, in each strip-shaped conductive element 201, the transmission and reception cable 505 was connected in parallel with the capacitor 502 closest to the end and near the upper and lower parts of the antenna 200.

Electromagnetic field simulation was performed in the antenna 200 having the configuration explained above. First, with changing frequency of electromagnetic waves supplied via the transmission and reception cable 505, impedance Z of the antenna 200 was measured. As a result, a resonance peak of high impedance Z appeared at around 128 MHz (magnetic resonance frequency of hydrogen nucleus at 3 teslas), which was a frequency used in the 3—tesla MRI apparatus 100. Thus, it was demonstrated that the antenna 200 of the aforementioned embodiment resonated at a frequency of around 128 MHz.

Then, sensitivity profile of the antenna 200 having the configuration explained above was investigated. In this example, sensitivity of the antenna 200 at the center was determined by electromagnetic field simulation for a case of supplying electromagnetic waves of the aforementioned frequency having the same intensity, but different phases of 0, 90, 180, and 270 degrees, to four of the feeding points 302, respectively. In this simulation, a phantom simulating histological composition of a male human having a body weight of 65 kg was constituted on a computer and placed inside the antenna 200.

If the sensitivity in the section at the center perpendicular to the axis of the elliptic cylinder is represented in the unit of microtesla, which is intensity of the magnetic field generated with a total input power of 1 W, a magnetic field of about 0.19 microtesla was generated at the center of the elliptic cylinder of the antenna 200 of this embodiment. Thus, it was demonstrated by the above result that there was obtained sensitivity in a range necessary and sufficient for usual examination conducted by using a common MRI apparatus.

As described above, it was demonstrated that according to the antenna 200 of the first embodiment shown in FIG. 2, an antenna showing a sensitivity profile comparable to that of a conventional type antenna, and able to secure a wide internal space with maintaining the external diameter could be provided.

Therefore, according to the aforementioned embodiments, there can be provided RF coils for MRI providing comfortableness to persons who enter into the inside thereof for getting an examination, with maintaining the required performance, but without raising cost.

In addition, the antennas of the aforementioned embodiments can be applied to not only an RF coil 103 of an MRI apparatus, but also any instruments using electromagnetic waves having a frequency of from several megahertzs to several gigahertzs.

Denotation of Reference Numerals

100: MRI Apparatus, 101: magnet, 102: gradient coil, 103: RF coil, 104: transceiver, 105: data processing part, 106: transmission and reception cable, 107: gradient magnetic field control cable, 108: display, 109: gradient magnetic field power supply, 111: bed, 112: subject, 200: antenna, 200b: antenna, 201: strip-shaped conductive element, 201b: strip-shaped conductive element, 202: cylindrical conductive element, 211: meander line, 211a: meander line, 211b: meander line, 211c: meander line, 301: conductive element connecting meander lines, 302: connecting point, 501: gap, 502: capacitor, 503: transmission and reception means, 504: matching and balance circuit, 505: feeding and receiving cable, 601: arrow indicating electric current, 602: arrow indicating electric current, 603: end of strip-shaped conductive element, 604: meandering width of meander line, 701: node of electric current, 702: arrow indicating electric current 703: arrow indicating electric current, 801: node of electric current, 802: arrow indicating electric current, 1001: capacitor, 1201: conductive element, 1202: capacitor

The invention claimed is:

1. A magnetic resonance examination apparatus, which comprises an antenna device used for at least one of transmission and reception of a signal and comprising:
   a hollow cylindrical conductive element, and
   at least two of conductive elements disposed at a certain distance from internal surface of the cylindrical conductive element substantially in parallel with the center axis of the cylindrical conductive element and having a meandering portion between both ends, wherein
   each of the conductive elements has a feed point.

2. The magnetic resonance examination apparatus according to claim 1, wherein:
   the conductive elements having a meandering portion are conductive elements having a predetermined width due to meandering.

3. The magnetic resonance examination apparatus according to claim 2, wherein:
   the conductive elements having a meandering portion are constituted with a plurality of meandering portions connected with a conductive element,
   each of the plurality of meandering portions is turned from the conductive element connecting the plurality of meandering portions.

4. The magnetic resonance examination apparatus according to claim 1, which further comprises:
   a capacitor disposed at a gap provided in each of the conductive elements to connect the conductive elements, and
   as the feed point, a connection means for connection with a transmission and reception means for performing at least one of transmission and reception of the signal, which is connected with the capacitor.

5. A magnetic resonance examination apparatus, which comprises an antenna device used for at least one of transmission and reception of a signal and comprising:
   a hollow cylindrical conductive element,
   one or more strip-shaped conductive elements,
   one or more capacitors disposed at one or more gaps provided in the strip-shaped conductive elements and connected with the conductive elements in series, and
   a connecting means for connection with a transmission and reception means for performing at least one of transmission and reception of the signal, which is connected with one of the capacitors in parallel, wherein:
   the strip-shaped conductive elements are disposed at a certain distance from internal surface of the cylindrical conductive element in the shape of a line substantially parallel to the center axis of the cylindrical conductive element,
   lengths of the strip-shaped conductive elements are adjusted so that they resonate at frequency of the signal, and number of nodes of current distributions observed in the lines of the strip-shaped conductive elements at the time of resonation thereof is 0 or a natural number of 1 or larger.

6. The magnetic resonance examination apparatus according to claim 5, which further comprises:
a conductive element disposed between adjacent two of the strip-shaped conductive elements substantially in parallel to the center axis of the cylindrical conductive element at a certain distance from internal surface of the cylindrical conductive element, and
two capacitors connecting both ends of the conductive element and the cylindrical conductive element, and wherein
electromagnetic coupling between two of the strip-shaped conductive elements can be suppressed by controlling capacitances of the capacitors.

7. The magnetic resonance examination apparatus according to claim 5, wherein:
the cylindrical conductive element is a circular cylindrical conductive element.

8. The magnetic resonance examination apparatus according to claim 5, wherein:
the cylindrical conductive element is an elliptic cylindrical conductive element.

9. A magnetic resonance examination apparatus, which comprises an antenna device used for at least one of transmission and reception of a signal and comprising:
a hollow cylindrical conductive element,
one or more strip-shaped conductive elements,
one or more capacitors disposed at one or more gaps provided in the strip-shaped conductive elements and connected with the conductive elements in series, and
a connecting means for connection with a transmission and reception means for performing at least one of transmission and reception of the signal, wherein:
each of the strip-shaped conductive elements comprises N of lines disposed at a certain distance from internal surface of the cylindrical conductive element, substantially in parallel to the center axis of the cylindrical conductive element with intervals between the lines for the circumferential direction of the cylindrical conductive element,
N of the lines are each connected at one end to end of the adjacent line with a conductive element so that the lines constitute one turned strip-shaped conductive element as a whole,
lengths of the whole strip-shaped conductive elements are adjusted so that the strip-shaped conductive elements resonate at frequency of the signal, and
number of nodes of current distributions observed in the lines of the strip-shaped conductive elements at the time of resonation thereof is $(M+1) \times N-1$, wherein M is 0 or a natural number of 1 or larger.

10. The magnetic resonance examination apparatus according to claim 9, wherein:
distances between the cylindrical conductive element and N of the lines are not constant.

11. A magnetic resonance examination apparatus, which comprises an antenna device used for at least one of transmission and reception of a signal and comprising:
a hollow cylindrical conductive element,
one or more strip-shaped conductive elements,
one or more capacitors disposed at one or more gaps provided in the strip-shaped conductive elements and connected with the conductive elements in series, and
a connecting means for connection with a transmission and reception means for performing at least one of transmission and reception of the signal, which is connected in parallel with one of two capacitors connecting both ends of the strip-shaped conductive element and the cylindrical conductive element, wherein:
each of the strip-shaped conductive elements comprises N of lines disposed at a certain distance from internal surface of the cylindrical conductive element substantially in parallel to the center axis of the cylindrical conductive element with intervals between the lines for the circumferential direction of the cylindrical conductive element,
N of the lines are each connected at one end to end of the adjacent line with a conductive element so that the lines constitute one turned strip-shaped conductive element as a whole,
lengths of the whole strip-shaped conductive elements are adjusted so that the strip-shaped conductive elements resonate at frequency of the signal, and
number of nodes of current distributions observed in the lines of the strip-shaped conductive elements at the time of resonation thereof is $(M+1) \times N-1$, wherein M is 0 or a natural number of 1 or larger.

12. A magnetic resonance examination apparatus, which comprises an antenna device used for at least one of transmission and reception of a signal and comprising:
a hollow cylindrical conductive element,
one or more strip-shaped conductive elements,
one or more capacitors disposed at one or more gaps provided in the strip-shaped conductive elements and connected with the conductive elements in series, and
a connecting means for connection with a transmission and reception means for performing at least one of transmission and reception of the signal, which is connected in parallel with one of the capacitors, wherein:
each of the strip-shaped conductive elements comprises N of lines disposed at a certain distance from internal surface of the cylindrical conductive element substantially in parallel to the center axis of the cylindrical conductive element with intervals between the lines for the circumferential direction of the cylindrical conductive element,
N of the lines are each connected at both ends to both end of the adjacent line, respectively,
lengths of the whole strip-shaped conductive elements are adjusted so that the strip-shaped conductive elements resonate at frequency of the signal, and
number of nodes of current distributions observed in the lines of the strip-shaped conductive elements at the time of resonation thereof is $(M+1) \times N-1$, wherein M is 0 or a natural number of 1 or larger.

13. An antenna device used for at least one of transmission and reception of a signal, which comprises:
a hollow cylindrical conductive element, and
at least two of conductive elements disposed at a certain distance from internal surface of the cylindrical conductive element substantially in parallel to the center axis of the cylindrical conductive element and having a meandering portion between both ends, and wherein
each of the conductive elements has a feed point.

* * * * *